United States Patent
Brewer et al.

(10) Patent No.: US 9,461,755 B2
(45) Date of Patent: Oct. 4, 2016

(54) ENHANCED VOLTAGE STANDING WAVE RATIO MEASUREMENT

(71) Applicant: ViaSat, Inc., Carlsbad, CA (US)

(72) Inventors: Kenneth P. Brewer, Gilbert, AZ (US); Salah M. Osman, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 84 days.

(21) Appl. No.: 14/599,338

(22) Filed: Jan. 16, 2015

(65) Prior Publication Data

US 2016/0211928 A1 Jul. 21, 2016

Related U.S. Application Data

(60) Provisional application No. 61/928,942, filed on Jan. 17, 2014.

(51) Int. Cl.
| | |
|---|---|
| *H04B 17/00* | (2015.01) |
| *H04B 17/10* | (2015.01) |
| *G01R 29/10* | (2006.01) |
| *G01R 27/06* | (2006.01) |
| *H04B 1/04* | (2006.01) |

(52) U.S. Cl.
CPC ............. *H04B 17/103* (2015.01); *G01R 27/06* (2013.01); *G01R 29/10* (2013.01); *H04B 1/04* (2013.01)

(58) Field of Classification Search
CPC G01R 27/06; G01R 19/0053; H04B 1/0475; H03F 1/3247
USPC ................ 455/115.1, 226.1, 67.11; 375/296; 324/637
See application file for complete search history.

(56) References Cited

U.S. PATENT DOCUMENTS

| | | | |
|---|---|---|---|
| 5,424,694 A | 6/1995 | Maloratsky et al. | |
| 7,339,366 B2 * | 3/2008 | Li | G01R 21/01 324/95 |
| 7,429,903 B2 | 9/2008 | Antkowiak | |

(Continued)

FOREIGN PATENT DOCUMENTS

| | | |
|---|---|---|
| EP | 1296146 A1 | 3/2003 |
| EP | 1947464 A1 | 7/2008 |
| JP | 61-288166 | 12/1986 |

OTHER PUBLICATIONS

Narda Microwave-East an L3 Company; "Couplers"; pp. 69-75, retrieved at www.nardamicrowave.com.

(Continued)

*Primary Examiner* — Sonny Trinh
(74) *Attorney, Agent, or Firm* — Holland & Hart LLP

(57) ABSTRACT

Enhanced RF system measurement including measurement of reflected power of a transmission system using two directional couplers configured to couple reflected power (e.g., isolate forward power). The directional couplers may be placed at a distance of ¼ wave separation and measurements from the two directional couplers may be averaged to obtain a reflected power for the transmission path. The enhanced measurement of reflected power may be used to obtain a more accurate VSWR or return loss measurement. An indication of the reflected power (e.g., VSWR, return loss, etc.) may be fed back to a source, which may adjust transmit power based on the measured VSWR to achieve a certain amount of power conveyed to the load (e.g., target radiated power from an antenna, etc.). Error conditions may be detected and the source may terminate transmission to prevent potential adverse operating conditions.

20 Claims, 12 Drawing Sheets

(56) References Cited

U.S. PATENT DOCUMENTS

| | | |
|---|---|---|
| 7,567,146 B2 | 7/2009 | Tervo |
| 7,863,997 B1 | 1/2011 | Alton et al. |
| 8,155,037 B2 * | 4/2012 | Kasai ............... H04B 1/44 370/310 |
| 8,294,530 B2 | 10/2012 | Van Swearingen et al. |
| 9,054,759 B2 * | 6/2015 | Watanabe ............ H03F 1/3247 375/278 |
| 2002/0113600 A1 * | 8/2002 | Swank, II ............. G01R 27/06 324/637 |
| 2011/0279192 A1 | 11/2011 | Nash et al. |
| 2012/0262249 A1 | 10/2012 | Morgenstern et al. |
| 2013/0106440 A1 | 5/2013 | Brunner |
| 2013/0241769 A1 | 9/2013 | Brannan et al. |
| 2013/0293317 A1 | 11/2013 | Zeller et al. |
| 2014/0210450 A1 | 7/2014 | Barabash et al. |

OTHER PUBLICATIONS

Tiley, Jack: "VSWR and Antenna Tuners", 46 pages.

Jorgesen, et al.; "Directivity and VSWR Measurements: Understanding Return Loss Measurements", © 2012 Marki Microwave, Inc., 8 pgs.

* cited by examiner

ENHANCED VOLTAGE STANDING WAVE RATIO MEASUREMENT

CROSS-REFERENCES

The present Application for Patent claims priority to U.S. Provisional Patent Application No. 61/928,942 by Brewer et al., entitled "Method and Apparatus for Accurate Voltage Standing Wave Ratio Measurement," filed Jan. 17, 2014, assigned to the assignee hereof, and expressly incorporated by reference herein for any and all purposes.

GOVERNMENT RIGHTS

This invention was made with government support under Contract Number N000309-00-D-2101, awarded by Space and Naval Warfare Systems Command (SPAWAR). The government has certain rights in the invention.

BACKGROUND

1. Field of the Disclosure

The present disclosure, for example, relates to communications systems, and more particularly to measuring voltage standing wave ratio (VSWR) in a radio frequency (RF) communications system.

2. Relevant Background

Microwave or RF transmission systems may have impedance differences between a source or transmission line and a load. Impedance mismatches result in reflection of some of the forward or transmitted power in the opposite direction. The reflected power may result in standing waves along a transmission line. The standing waves may be characterized by a voltage standing wave ratio (VSWR) measurement, which provides an indication of the impedance mismatch of the load.

Accurate measurement of VSWR may be important to various communication systems. For example, certain frequency bands have regulated limits on radiated power, and determining radiated power accurately may depend on accurate measurement of VSWR or return loss. In some cases, it may be difficult to characterize a transmission system accurately, and transmitters may be operationally connected to different loads. For example, a Link 16 transmitter may be designed to work in various airplanes and vehicles, and may be connected to different antennas for each application.

Various techniques have been used to measure the VSWR of a system or part of a system. For example, a bidirectional or dual-directional coupler can be inserted in the path which has the VSWR to be measured. The coupler is usually inserted after an amplifier and the path is often common to both transmit and receive, though that is not necessary. The forward power and the reverse power can then both be measured and compared to each other.

However, the directivity of the coupler significantly affects the measurement, as the incident and reflected waves interact with each other causing the voltage vectors of the waves to sum. The amount of error is dependent upon the interacting phase angle, the load impedance, and the power levels of the signals (with the reverse power level being a function of both the forward power, and the load impedance). As a result, the accuracy of using couplers to measure the VSWR of a system typically depends significantly on the directivity of the coupler used for measurement. Therefore, accurate measurement of VSWR provides challenges in RF systems.

SUMMARY

The present disclosure, for example, provides techniques for enhanced RF system measurement. The techniques include enhanced measurement of reflected power of a transmission system using two directional couplers configured to couple reflected power (e.g., isolate forward power). The directional couplers may be placed at a distance of ¼ wave separation and measurements from the two directional couplers may be averaged to obtain a reflected power for the transmission path. The enhanced measurement of reflected power may be used to obtain a more accurate voltage standing wave ratio (VSWR) or return loss measurement. An indication of the reflected power (e.g., VSWR, return loss, etc.) may be fed back to a source, which may adjust transmit power based on the measured VSWR to achieve a certain amount of power conveyed to the load (e.g., target radiated power from an antenna, etc.). Error conditions may be detected and the source may terminate transmission to prevent potential adverse operating conditions.

A transmitter system for wireless communication is described, including a first directional coupler coupled with a transmission path and having a coupler directivity in a reflected power direction, the first directional coupler outputting a first coupled power of the transmission path, a second directional coupler coupled with the transmission path and having a coupler directivity in the reflected power direction, the second directional coupler outputting a second coupled power of the transmission path, wherein the second directional coupler is located to couple the second coupled power at a one-quarter wavelength distance at an operational frequency from the first coupled power along the transmission path, and a measurement device configured to measure the first coupled power and the second coupled power and determine a reflected power of the transmission path based on an average of the measured first coupled power and the measured second coupled power.

In some embodiments, the transmitter system includes a third directional coupler coupled with the transmission path and having a coupler directivity in a forward power direction, the third directional coupler outputting a third coupled power. The measurement device may be configured to measure the third coupled power and determine a VSWR of the transmission path based on the third coupled power and the reflected power. In some embodiments, the third directional coupler is located in-between the first directional coupler and the second directional coupler along the transmission path. The first and second directional couplers may be coplanar with the transmission path. In some embodiments, the third directional coupler is located to couple the third coupled power at a one-eighth wavelength distance at the operational frequency from the first coupled power along the transmission path.

In some embodiment, the transmitter system includes a fourth directional coupler coupled with the transmission path and having a coupler directivity in a forward power direction, the fourth directional coupler outputting a fourth coupled power. The fourth directional coupler may be located to couple the fourth coupled power at a one-quarter wavelength distance at the operational frequency from the third coupled power along the transmission path. The measurement device may be configured to measure the fourth coupled power and determine the VSWR of the transmission path further based on the measured fourth coupled power.

In some embodiments, the first and second directional couplers may be any of stripline couplers, microstrip couplers, coaxial couplers, waveguide couplers, or combinations thereof.

In some embodiments, the transmitter system includes a transmitter coupled to the transmission path and to the measurement device, wherein the transmitter adjusts a transmit power of a signal transmitted via the transmission path based at least in part on the reflected power. The transmitter may adaptively adjust the transmit power of the signal based at least in part on the reflected power to generate a transmitted signal from an antenna system coupled to the transmission path at a predetermined power level. In some embodiments, the transmitter is configured to sense a transmit error condition based at least in part on the reflected power and terminate transmission based on the sensed transmit error condition.

Some embodiments are directed to a method for wireless communication, including measuring a first coupled power of a transmission path at a first directional coupler coupled with the transmission path and having a coupler directivity in a reflected power direction, measuring a second coupled power of the transmission path at a second directional coupler coupled with the transmission path and having a coupler directivity in the reflected power direction, wherein the second directional coupler is located to couple the second coupled power at a one-quarter wavelength distance at an operational frequency from the first coupled power along the transmission path, and determining a reflected power of the transmission path based on an average of the measured first coupled power and the measured second coupled power.

In some embodiments, the method includes measuring a third coupled power at a third directional coupler coupled with the transmission path and having a coupler directivity in a forward power direction, and determining a VSWR of the transmission path based on the measured third coupled power and the reflected power.

In some embodiments, the method includes measuring a fourth coupled power at a fourth directional coupler coupled with the transmission path and having a coupler directivity in the forward power direction, wherein the fourth directional coupler is located to couple the fourth coupled power at a one-quarter wavelength distance at the operational frequency from the third coupled power along the transmission path. Determining the VSWR of the transmission path may be further based on the measured third coupled power.

In some embodiments, the method includes adjusting a transmit power of a signal transmitted via the transmission path based at least in part on the reflected power. The adjusting may include adaptively adjusting the transmit power of the signal based at least in part on the reflected power to generate a transmitted signal from an antenna system coupled to the transmission path at a predetermined power level.

In some embodiments, the method includes sensing a transmit error condition based at least in part on the reflected power and terminating transmission based on the sensed transmit error condition.

Some embodiments are directed to an apparatus for wireless communication, including means for coupling a first coupled power of a transmission path, the means for coupling the first coupled power having a coupler directivity in a reflected power direction, means for coupling a second coupled power of the transmission path, the means for coupling the second coupled power having a coupler directivity in the reflected power direction, wherein the means for coupling the second reflected power is located to couple the second coupled power at a one-quarter wavelength distance at an operational frequency from the first coupled power along the transmission path, means for measuring the first coupled power and the second coupled power, and means for determining a reflected power of the transmission path based on the measured first coupled power and the measured second coupled power.

In some embodiments, the apparatus includes means for coupling a third coupled power of the transmission path, the means for coupling the third coupled power having a coupler directivity in a forward power direction and means for determining a voltage standing wave ratio (VSWR) of the transmission path based on the measured third coupled power and the compensated reflected power.

In some embodiments, the means for coupling the third coupled power is located in-between the means for coupling the first coupled power and the means for coupling the second coupled power along the transmission path.

In some embodiments, the apparatus includes means for adjusting a transmit power of a signal transmitted via the transmission path based at least in part on the reflected power.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Techniques are described for enhanced RF system measurement. The techniques include enhanced measurement of reflected power of a transmission system using two directional couplers configured to couple reflected power (e.g., isolate forward power). The directional couplers may be placed at a distance of ¼ wave separation and measurements from the two directional couplers may be averaged to obtain a reflected power for the transmission path. The enhanced measurement of reflected power may be used to obtain a more accurate voltage standing wave ratio (VSWR) or return loss measurement. An indication of the reflected power (e.g., VSWR, return loss, etc.) may be fed back to a source, which may adjust transmit power based on the measured VSWR to achieve a certain amount of power conveyed to the load (e.g., target radiated power from an antenna, etc.). Error conditions may be detected and the source may terminate transmission to prevent potential adverse operating conditions.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Figure 1:
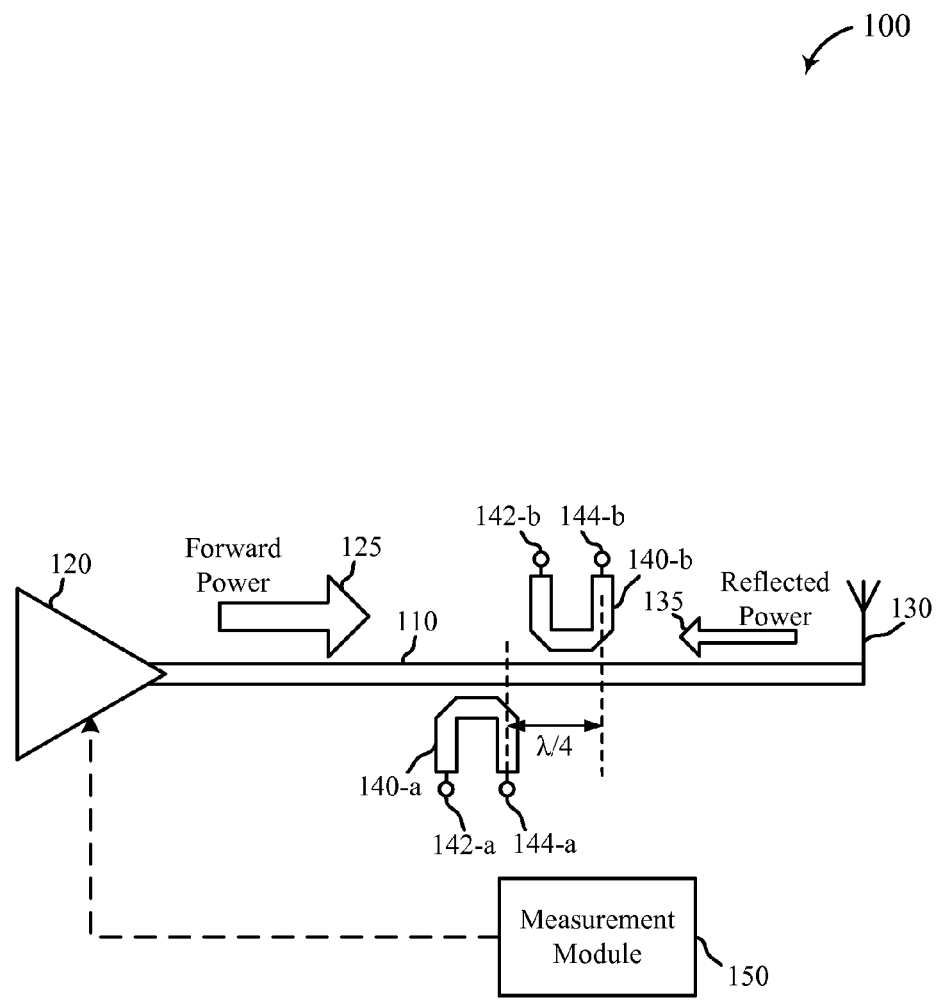
FIG. 1 illustrates a transmission system for enhanced RF system measurement, in accordance with various embodiments.

FIG. 1 illustrates a transmission system 100 for enhanced RF system measurement, in accordance with various embodiments. The transmission system 100 includes a source 120 (e.g., transmitter, etc.), transmission line 110, and load 130 (e.g., antenna, etc.). The source 120 may generate a signal including a forward RF power wave 125, which may be partially reflected to generate a reflected RF power wave 135 at the load 130 because of an impedance mismatch between the transmission line 110 and the load 130.

A directional coupler 140-a may be used to characterize how well the impedance of the load 130 matches the impedance of the transmission line 110, which may determine how much power is transferred to the load 130 (e.g., radiated by an antenna, etc.), and how much power will be reflected back to the source 120 as a return loss of the transmission system 100. The return loss may be characterized by the voltage standing wave ratio (VSWR) on the transmission line 110, which is the ratio of the maximum voltage to the minimum voltage of a standing wave on the transmission line 110. For example, the return loss (in dB) may be given by the equation:

$$RL = -20 \cdot \log(VSWR+1)/(VSWR-1)$$

The directional coupler 140-a may be a bidirectional coupler or dual-directional coupler with a coupled forward power port 142-a and a coupled reflected power port 144-a. The directional coupler 140-a may provide isolation in the forward direction at the coupled reflected power port 144-a, meaning that no signal (with ideal isolation) due to the forward RF power wave 125 appears at the coupled reflected power port 144-a. Similarly, the directional coupler 140-a may provide isolation in the reverse direction at the coupled forward power port 142-a. In practice, however, directional couplers do not have ideal isolation. How well the directional coupler discriminates between forward and reverse waves may be characterized by the directivity of the coupler in the forward or reverse direction. Directivity may be defined as the coupling ratio (e.g., in dB) in the undesired direction subtracted from the coupling ratio in the desired direction. A measurement of directivity for a coupler may also account for insertion loss (e.g., loss in dB of the measured signal due to the coupler, etc.). Types of directional couplers include waveguide couplers, coaxial couplers, stripline couplers, micro-strip couplers, and the like. Typical directional couplers may have directivity in the range of 10-50 dB, and the directivity of a directional coupler may depend on frequency.

The directivity of the coupler may significantly affect VSWR measurement, as the incident and reflected waves interact with each other causing the voltage vectors of the waves to sum. The amount of error is dependent upon the interacting phase angle, the load impedance, and the power levels of the signals (with the reflected power level being a function of both the forward power, and the load impedance). As a result, the accuracy of using couplers to measure the VSWR or return loss of a system typically depends very significantly on the Directivity of the coupler(s) involved, requiring very high precision components.

For example, forward error may be caused by leakage of the reflected wave power into the forward power measurement and reflected error may be caused by leakage of the forward wave power into the reflected power measurement. Minimizing the phase angle between measurements of forward and reflected power (e.g., by positioning forward and reflected coupling at the same position or an odd multiple of ½ wave separation, etc.) may improve accuracy because the apparent direction of the measured power is the same for both forward and reflected waves. Thus, the forward error and reflected error may partially cancel each other when VSWR is calculated from the forward and reflected power measurements.

However, the magnitude of the forward error and reflected error are typically not equal and error in VSWR measurement may be dominated by reflected power measurement inaccuracy. For example, where the directivity of a coupler measuring forward power and the directivity of a coupler measuring reflected power is the same, the relative magnitude of the reflected error compared to the measured reflected power may be much larger than the relative error of the forward error compared to the measured forward power, unless the load is substantially an open or short circuit. Thus, reflected power measurements are generally much more sensitive to the directivity of the directional coupler than the forward power measurements. For example, the directivity of the directional coupler may need to be 15 dB greater than the return loss to provide for a reflected error of less than 1 dB. For a system with relatively low VSWR (e.g., return loss greater than 10 dB, etc.), the directivity of the directional coupler may need to be very high (e.g., greater than 25 dB, etc.). However, improving directivity may require high precision components and may be difficult or expensive to include in a transmission system. Therefore, improving accuracy in the reflected power measurement without high directivity directional couplers may result in a large improvement to VSWR measurement accuracy without the tradeoffs of high directivity directional couplers.

In embodiments, the transmission system 100 includes the first directional coupler 140-a and a second directional coupler 140-b. The first directional coupler 140-a and the second directional coupler 140-b may be placed at a distance of ¼ wave separation (¼ wave separation distance is ½ wave electrically) along the transmission line 110. A measurement module 150 may obtain a first reflected power measurement at the coupled reflected power port 144-a of the first directional coupler 140-a and a second reflected power measurement at the coupled reflected power port 144-b of the second directional coupler 140-b. Because of the ¼ wave separation, the reflected error in the first reflected power measurement and the second reflected power measurement may have similar amplitudes and opposite signs.

The reflected power measured at the coupled reflected power port 144-a may be given by:

$$P_R = P_0 - C + 10 \cdot \log_{10}\left(10^{\frac{-IL-RL}{10}} + 10^{\frac{-D}{10}} + 2 \cdot 10^{\frac{-IL-RL-D}{20}} \cos\theta\right)$$

where:
$P_0$, is the input power;
C is the coupling ratio;
IL is the coupler insertion loss;
RL is the return loss at the load 130;
D is the directivity of the coupler; and
$\theta$ is the phase angle between the forward and reflected waves at the coupled reflected power port.

The error can be found by dividing (subtracting in dB) the desired power ($P_0$–IL–RL–C) to result in the error formula:

$$E_R = RL + IL + 10 \cdot \log_{10}\left(10^{\frac{-IL-RL}{10}} + 10^{\frac{-D}{10}} + 2 \cdot 10^{\frac{-IL-RL-D}{20}} \cos\theta\right)$$

For an example transmission system with IL=0.2, D=20.5 dB, and RL=2.922 dB (e.g., VSWR=6.0), the maximum reflected power error $E_R^{MAX}$ is 1.102 dB and the minimum reflected power error $E_R^{MIN}$ is −1.262 dB.

The reflected power measured at the coupled reflected power port 144-b of the second directional coupler 140-b may be given by the formula above, with $\theta$ offset by $\pi/2$. The measured power from the coupled reflected power port 144-a of the first directional coupler 140-a and the coupled reflected power port 144-a of the first directional coupler 140-a may be averaged to determine the reflected power. For the example transmission system given above where IL=0.2, D=20.5 dB, and RL=2.922 dB (e.g., VSWR=6.0), averaging reflected power measurements from the first and second directional couplers results in a maximum reflected power error $E_R^{MAX}$ of 0.0787 dB and a minimum reflected power error $E_R^{MIN}$ of −0.0802 dB. Thus, the measurement module 150 may obtain a more accurate measurement of the reflected power of the transmission system 100 by averaging the first reflected power measurement and the second reflected power measurement.

In embodiments, the measurement module 150 may feedback an indication of the measured VSWR (or return loss) to the transmitter 120, which may adjust transmit power based on the measured VSWR to achieve a certain amount of power conveyed to the load 130 (e.g., target radiated power from an antenna, etc.). The measurement module 150 may also detect error conditions that may indicate that an operational parameter (e.g., maximum reflected power, etc.) may be violated and the transmitter may terminate transmission to avoid potential adverse results.

Figure 2:
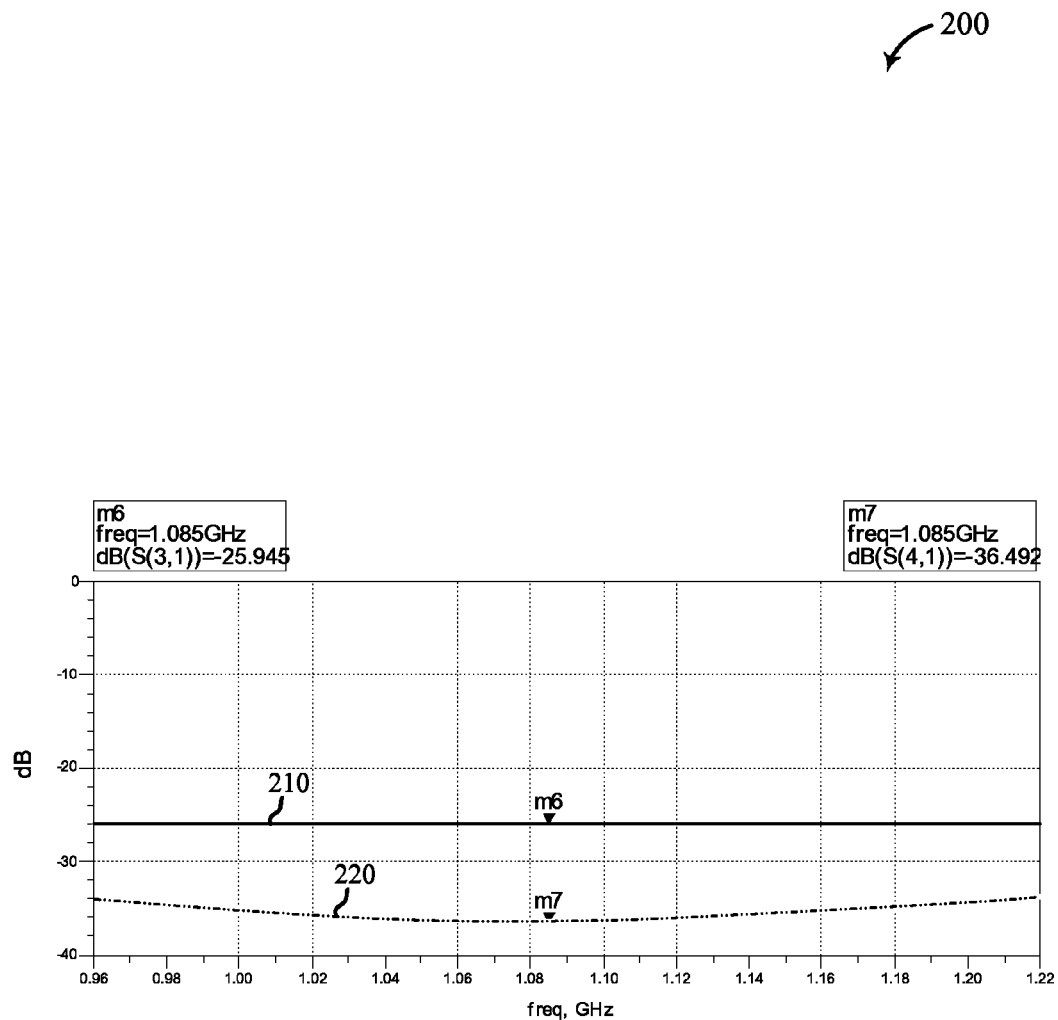
FIG. 2 illustrates a diagram showing frequency response for reflected power measurements, in accordance with various embodiments.

FIG. 2 illustrates a diagram 200 showing frequency response for reflected power measurements in accordance with various embodiments. Diagram 200 may illustrate, for example, coupled reflected power measurements from the directional couplers 140-a and 140-b illustrated in FIG. 1 across an example frequency range. The second directional coupler 140-b of FIG. 1 may be placed at a distance of ¼ wave separation at an operational frequency of 1.085 GHz from the first directional coupler 140-a.

A first measured reflected power 210 may be obtained at the coupled reflected power port 144-a of the first directional coupler 140-a. At the operational frequency, the first measured reflected power may be −25.945 dB. A second measured reflected power 220 may be obtained at the coupled reflected power port 144-b of the second directional coupler 140-b. At the operational frequency, the second measured reflected power may be −36.492 dB. A reflected power may be calculated based on an average of the first reflected power measurement and the second reflected power measurement.

Because the leaked forward power into the first reflected power measurement and the second reflected power measurement cancel, the calculated reflected power may be a more accurate measurement of the reflected power and may be relatively independent of the coupler directivity. Thus, relatively low directivity couplers may be used, and may be able to provide for an accurate measurement of reflected power even where the VSWR is low (e.g., closely matched load impedance, etc.).

As illustrated in FIG. 2, with the directional couplers placed at a distance of ¼ wave separation at the operational frequency, the calculated reflected power may be relatively insensitive to frequency variation within a range around the operational frequency.

Figure 3:
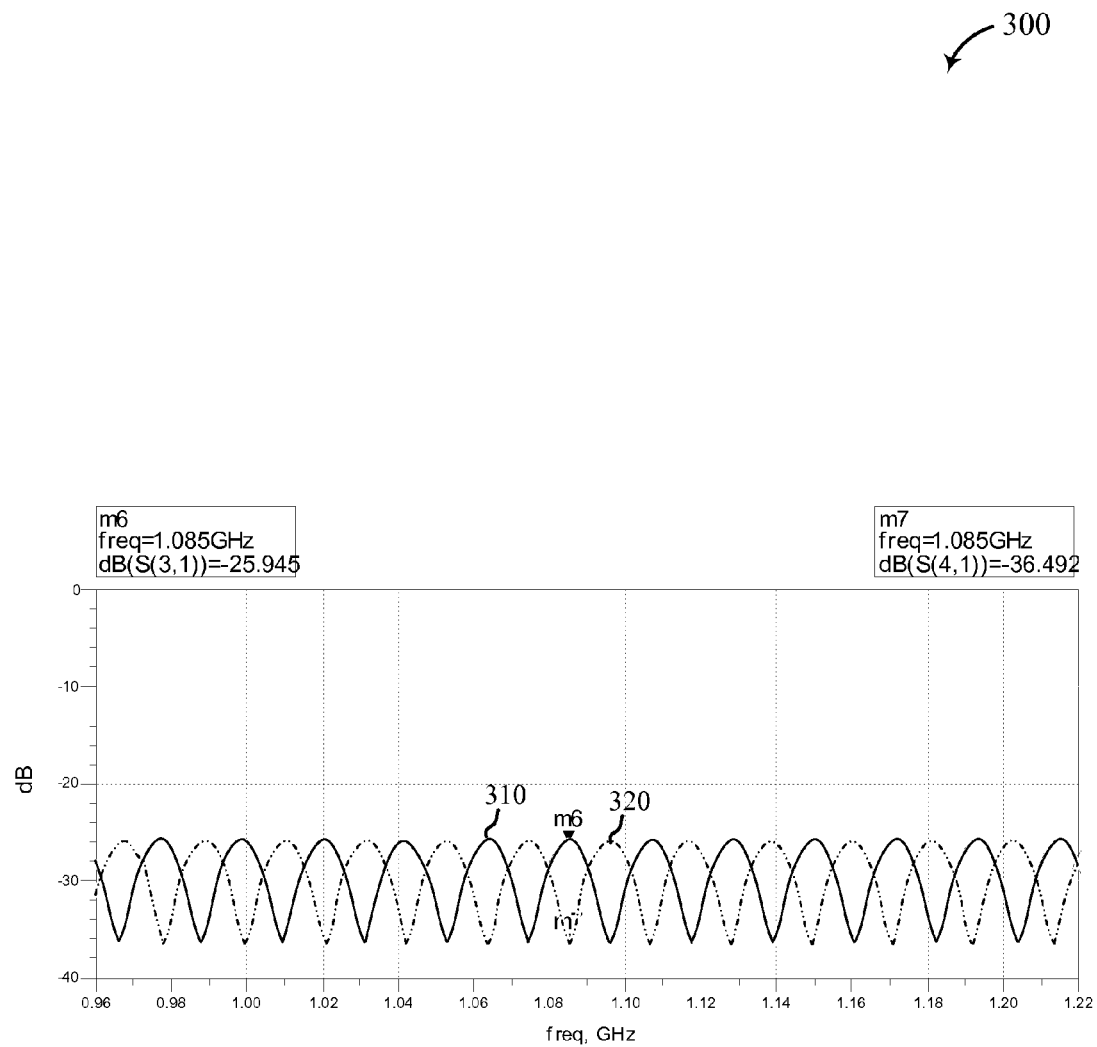
FIG. 3 shows a diagram of measured reflected power with directional couplers spaced at a multiple of ¼ wave separation, in accordance with various embodiments.

In some embodiments, the directional couplers may be placed a multiple of ¼ wave separation apart on the transmission line. FIG. 3 shows a diagram 300 of measured reflected power with directional couplers spaced at a multiple of ¼ wave separation, in accordance with various embodiments. In FIG. 3, for example, shows measured reflected power for directional couplers spaced 9045 degrees apart. As illustrated in FIG. 3, at the operational frequency of 1.085 GHz, the first measured reflected power 310 and second measured reflected power 320 may be equal, respectively, to the first measured reflected power 210 and second measured reflected power 220 of FIG. 2. As can be seen in FIG. 3, a calculated reflected power using an average of measured reflected power from directional couplers placed a multiple of ¼ wave separation may have less insensitivity to frequency variation than using ¼ wave separation.

Figure 4:
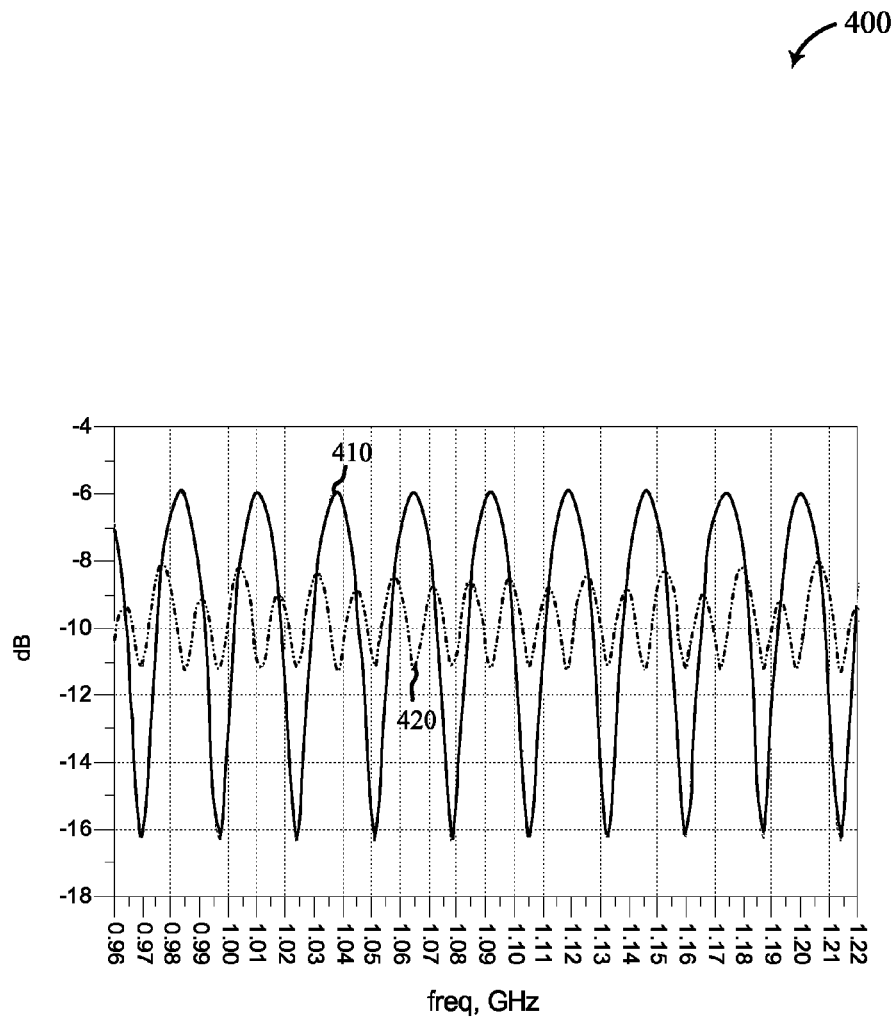
FIG. 4 shows a diagram of variation in reflected power measurements according to various embodiments.

FIG. 4 shows a diagram 400 of variation in reflected power measurements according to various embodiments. In diagram 400, reflected power measurement 410 shows the measured reflected power at a single directional coupler over a frequency range around an operational frequency (e.g., 1.085 GHz). Reflected power 420 shows the average measured reflected power at two directional couplers placed with ¼ wave separation along a transmission line. Reflected power 420 shows much less variation with frequency than does the single reflected power measurement 410. As can be understood, differences in phase angle for the reflected and forward power may produce similar results as the reflected error produces constructive and destructive interference across a range of phase angles. Thus, averaging measured reflected power from two directional couplers placed with ¼ wave separation may cancel reflected error and produce a more accurate reflected power for the transmission system.

Figure 5:
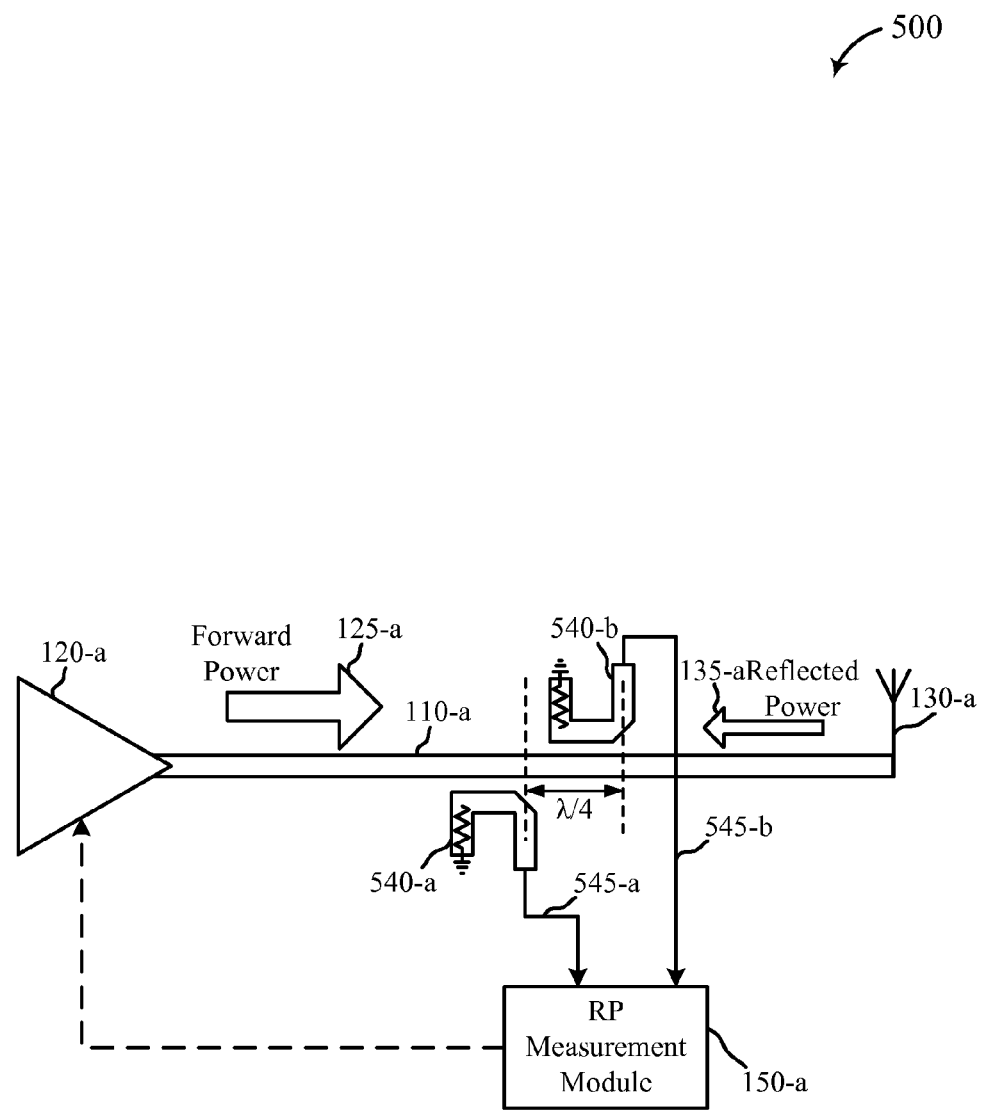
FIG. 5 shows a transmission system for enhanced RF system measurement, in accordance with various embodiments.

FIG. 5 shows a transmission system 500 for enhanced RF system measurement, in accordance with various embodiments. The transmission system 500 includes a source 120-a (e.g., transmitter, etc.), transmission line 110-a, and load 130-a (e.g., antenna, etc.). The source 120 may generate a signal including a forward RF power wave 125-a, which may be partially reflected to generate a reflected RF power wave 135-a at the load 130-a because of an impedance mismatch between the transmission line 110-a and the load 130-a. The transmitter 120-a, transmission line 110-a, and load 130-a may be the transmitter 120, transmission line 110, and load 130 of FIG. 1, respectively.

The transmission system 500 may include a first directional coupler 540-a and a second directional coupler 540-b. The first directional coupler 540-a and the second directional coupler 540-b may be unidirectional couplers (e.g., terminated at an isolation port, etc.) and may be any type of coupler including waveguide couplers, coaxial couplers, stripline couplers, micro-strip couplers, and the like. The first directional coupler 540-a and the second directional coupler 540-b may have coupled power ports configured to couple the reflected power 135-a (e.g., isolate the forward power 125-a).

The first directional coupler 540-a and the second directional coupler 540-b may be placed at a distance of ¼ wave separation (or a multiple of ¼ wave separation) along the transmission line 110-a. A measurement module 150-a may obtain a first reflected power measurement at the coupled power port 545-a of the first directional coupler 540-a and a second reflected power measurement at the coupled power port 545-b of the second directional coupler 540-b. Because of the ¼ wave separation, the reflected error in the first reflected power measurement and the second reflected power measurement may have similar amplitudes and opposite signs. The VSWR measurement module 150-a may calculate a reflected power of the transmission system 500 by averaging the first reflected power measurement and the second reflected power measurement.

In some embodiments, the transmission line 110-a may be a stripline or micro-strip transmission line. The first directional coupler 540-a may be on a first side of the transmission line 110-a and the second directional coupler 540-b may be on a second or opposite side of the transmission line 110-a. The first directional coupler 540-a and the second directional coupler 540-b may be coplanar (e.g., in the same stripline or micro-strip trace level, etc.) with the transmission line 110-a.

Figure 6:
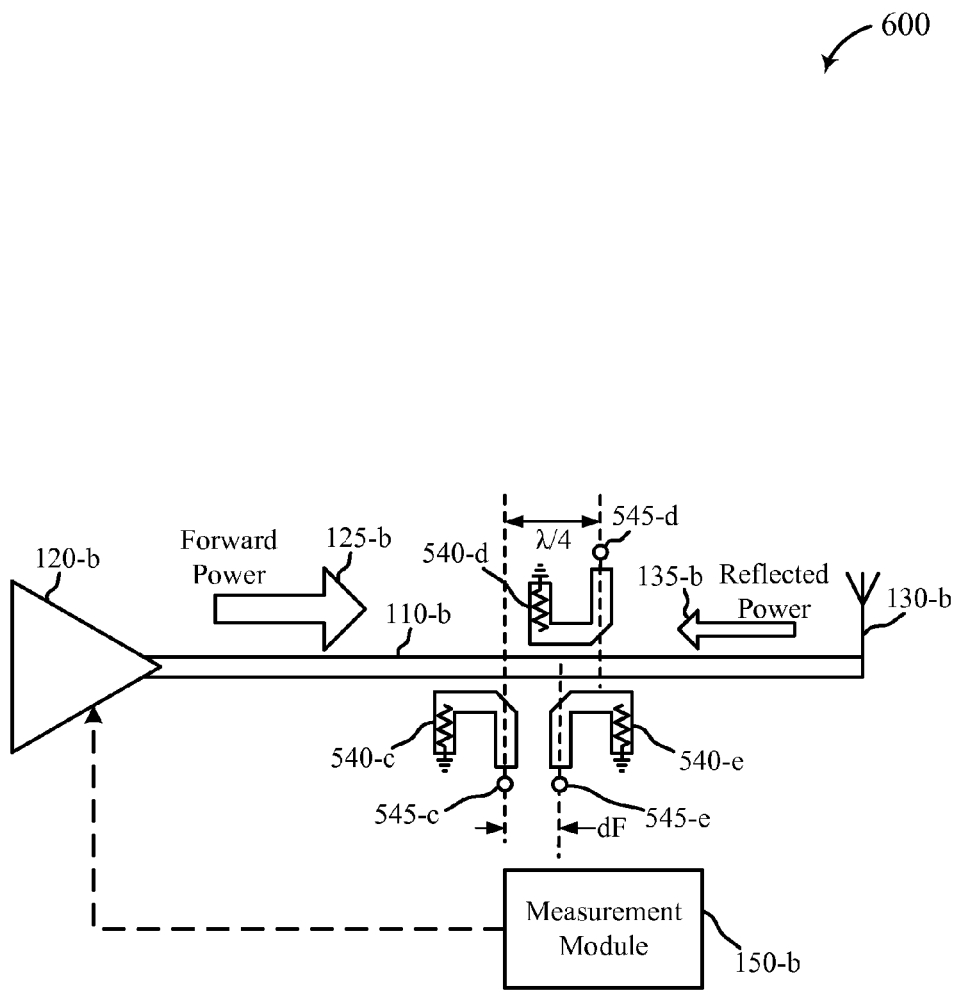
FIG. 6 shows a transmission system for enhanced RF system measurement, in accordance with various embodiments.

FIG. 6 shows a transmission system 600 for enhanced RF system measurement, in accordance with various embodiments. The transmission system 600 includes a source 120-b (e.g., transmitter, etc.), transmission line 110-b, and load 130-b (e.g., antenna, etc.). The source 120-b may generate a signal including a forward RF power wave 125-b, which may be partially reflected to generate a reflected RF power wave 135-b at the load 130-b because of an impedance mismatch between the transmission line 110-b and the load 130-b. The source 120-b, transmission line 110-b, and load 130-b may be, respectively, the source 120, transmission line 110, and load 130 of FIG. 1 or 5.

The transmission system 600 may include a first directional coupler 540-c and a second directional coupler 540-d which may have coupled power ports configured to couple the reflected power 135-b (e.g., isolate the forward power 125-b). The first directional coupler 540-c and the second directional coupler 540-d may be examples of the first directional coupler 540-a and the second directional coupler 540-b of FIG. 5. The first directional coupler 540-a and the second directional coupler 540-b may be placed at a distance of ¼ wave separation (or a multiple of ¼ wave separation) along the transmission line 110-b.

The transmission system 600 may include a third directional coupler 540-e, which may have a coupled power port 545-e configured to couple the forward power 125-b (e.g., isolate the reflected power 135-b). The third directional coupler 540-e may be a unidirectional coupler (e.g., terminated at an isolation port, etc.) and may be any type of coupler including waveguide couplers, coaxial couplers, stripline couplers, micro-strip couplers, and the like.

The transmission system 600 may include measurement module 150-b, which may determine VSWR (or return loss) based on measurements of coupled power from the first directional coupler 540-c, second directional coupler 540-d, and third directional coupler 540-e. For example, the measurement module 150-b may determine the forward power based on a measurement of the coupled power port 545-e and may determine the reflected power based on an average of measurements of power at the coupled power ports 545-c and 545-d of the first and second directional couplers 540-c and 540-d, respectively.

As discussed above, there may be some benefit to positioning forward and reflected coupling at the same position or an odd multiple of ½ wave separation along the transmission line 110-b. In some embodiments, the third directional coupler 540-e may be placed at the same position along the transmission line 110-b as the first or second directional couplers 540-c or 540-d (e.g., dF=0, etc.). In other embodiments, the third directional coupler 540-e may be placed in-between the first directional coupler 540-c and the second directional coupler 540-d along the transmission line 110-b. For example, the third directional coupler 540-e may be equally spaced from the first directional coupler 540-c and the second directional coupler 540-d (e.g., dF=⅛ wave separation, etc.). Placing the third directional coupler 540-e in-between the first directional coupler 540-c and the second directional coupler 540-d may result in partial cancellation of forward error and reflected error when the reflected power is measured based on an average of the measured power at the first and second directional couplers.

In some embodiments, the transmission line 110-b may be a stripline or micro-strip transmission line. The first directional coupler 540-c may be coplanar with the second directional coupler 540-d and may be on an opposite side of the transmission line 110-b. The third directional coupler 540-e may be coplanar with the transmission line 110-b and may be on the same side of the transmission line 110-b as the first or second directional couplers 540-c or 540-d. Alternatively, the third directional coupler 540-e may be on a different stripline or micro-strip trace level. For example, the first and second directional couplers 540-c and 540-d may be fabricated on the same stripline or micro-strip trace level of a printed circuit board (PCB) as the transmission line 110-b while the third directional coupler 540-e may be fabricated as a trace above or below the transmission line 110-b.

Figure 7:
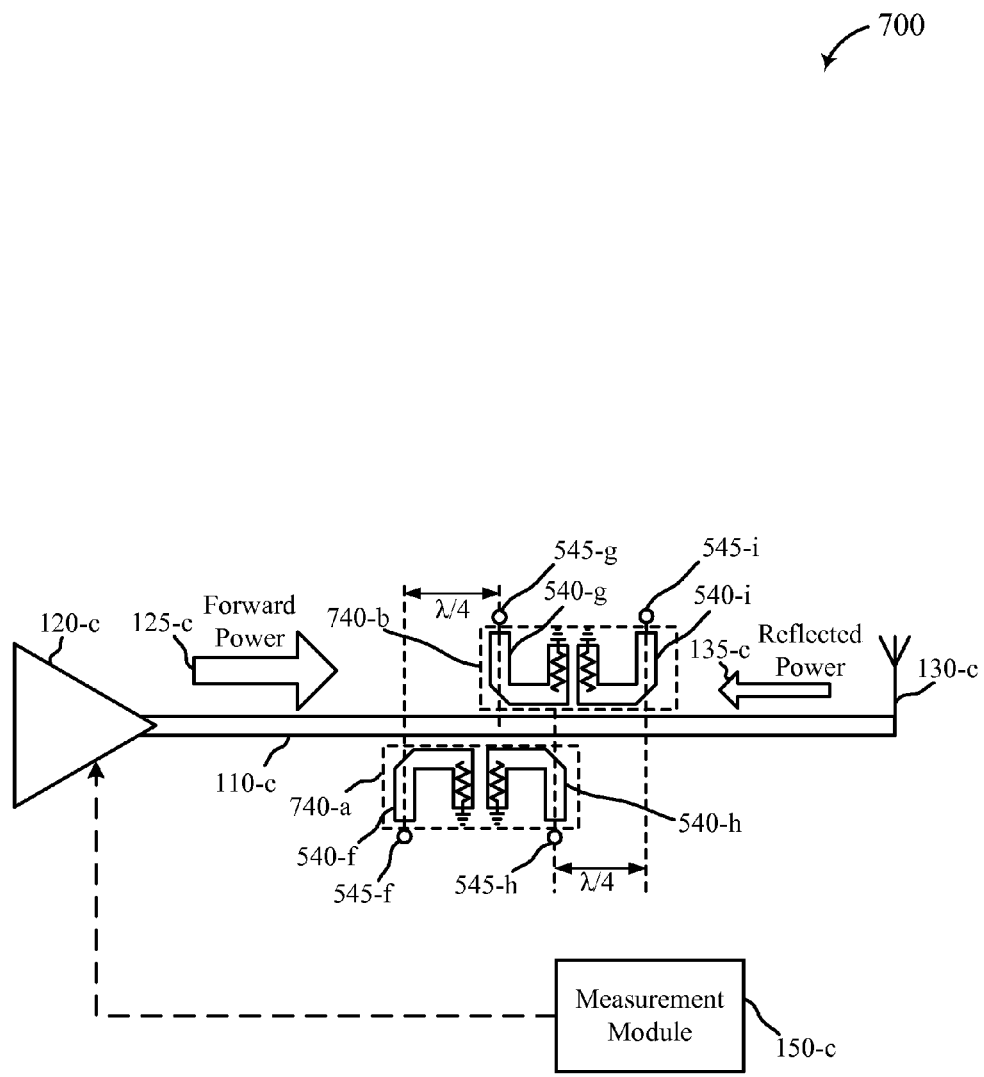
FIG. 7 shows a transmission system for enhanced RF system measurement, in accordance with various embodiments.

FIG. 7 shows a transmission system 700 for enhanced RF system measurement, in accordance with various embodiments. The transmission system 700 includes a source 120-c (e.g., transmitter, etc.), transmission line 110-c, and load 130-c (e.g., antenna, etc.). The source 120-c may generate a signal including a forward RF power wave 125-c, which may be partially reflected to generate a reflected RF power wave 135-c at the load 130-c because of an impedance mismatch between the transmission line 110-c and the load 130-c. The source 120-c, transmission line 110-c, and load 130-c may be, respectively, the source 120, transmission line 110, and load 130 of FIG. 1, 5 or 6.

The transmission system 700 includes a first directional coupler 540-f and a second directional coupler 540-g which may have coupled power ports configured to couple the reflected power 135-c (e.g., isolate the forward power 125-c). The first directional coupler 540-f and the second directional coupler 540-g may be examples of the directional couplers 540 of FIG. 5 or 6. The first directional coupler 540-f and the second directional coupler 540-g may be placed at a distance of ¼ wave separation (or a multiple of ¼ wave separation) along the transmission line 110-c.

The transmission system 700 includes a third directional coupler 540-h and a fourth directional coupler 540-i, which may have a coupled power ports 545 configured to couple the forward power 125-c (e.g., isolate the reflected power 135-c). The third and fourth directional couplers 540-h and 540-i may be unidirectional couplers (e.g., terminated at an isolation port, etc.) and may be any type of coupler including waveguide couplers, coaxial couplers, stripline couplers, micro-strip couplers, and the like. In some cases, the third directional coupler 540-h and the fourth directional coupler 540-i may be placed at a distance of ¼ wave separation (or a multiple of ¼ wave separation) from each other along the transmission line 110-c.

In some cases, the first directional coupler 540-f and third directional coupler 540-h may be components of a first dual-directional coupler 740-a and the second directional coupler 540-g and fourth directional coupler 540-i may be components of a second dual-directional coupler 740-b.

The transmission system 700 may include measurement module 150-c, which may determine reflected power based on measurements of coupled power from the first directional coupler 540-f, second directional coupler 540-g, third directional coupler 540-h, and fourth directional coupler 540-i. For example, the measurement module 150-c may determine the forward power based on measurements of the coupled power ports 545-h and 545-i (e.g., average, maximum, minimum, etc.). The measurement module 150-c may determine the reflected power based on an average of measurements of coupled power at the coupled power ports 545-f and 545-g of the first and second directional couplers 540-f and 540-g, respectively. The measurement module 150-c may determine VSWR (or return loss) from the calculated forward and reflected power.

Figure 8:
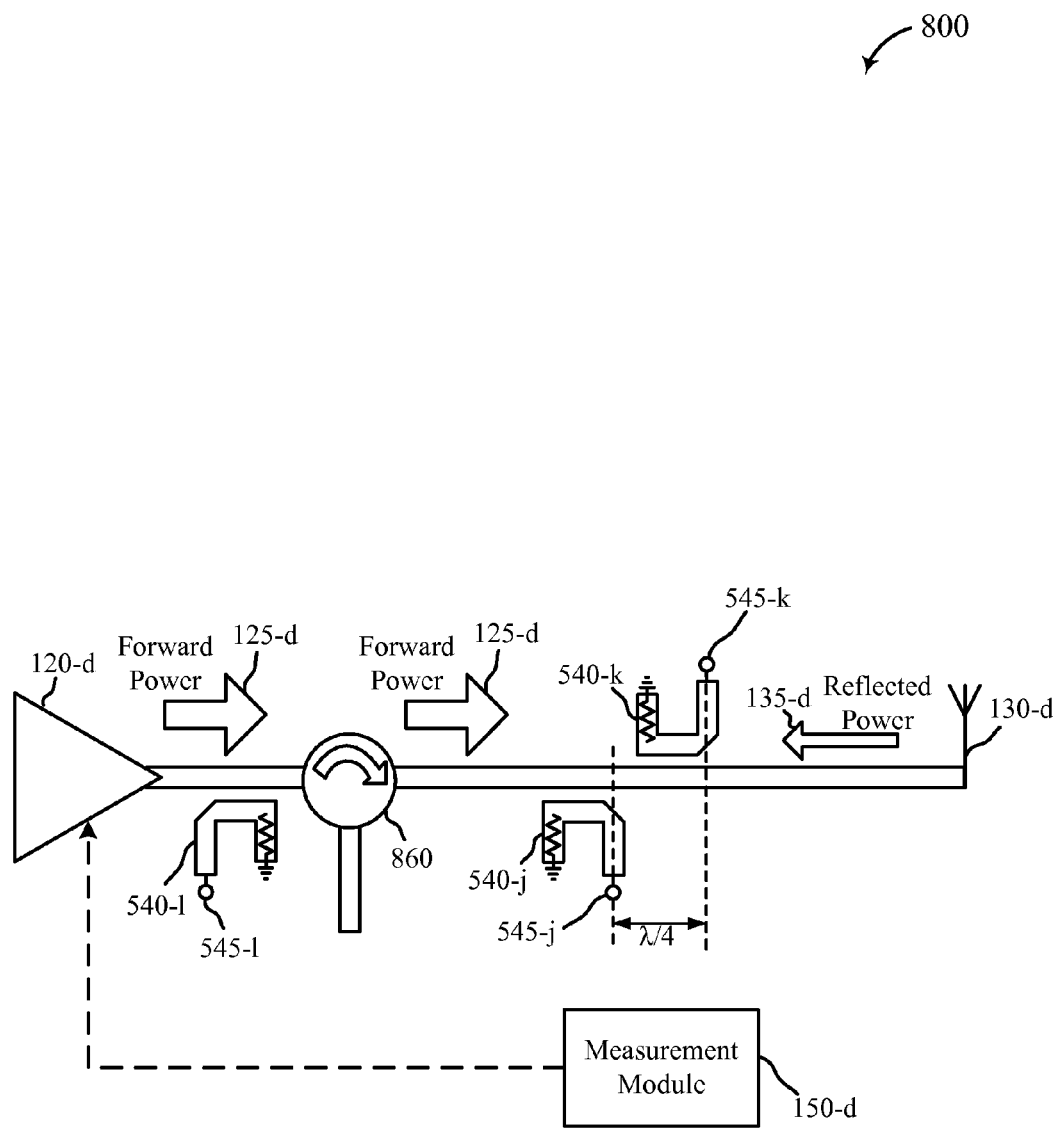
FIG. 8 shows a transmission system for enhanced RF system measurement, in accordance with various embodiments.

FIG. 8 shows a transmission system 800 for enhanced RF system measurement, in accordance with various embodiments. The transmission system 800 includes a source 120-d (e.g., transmitter, etc.), transmission line 110-d, and load 130-d (e.g., antenna, etc.). The source 120-d may generate a signal including a forward RF power wave 125-d, which may be partially reflected to generate a reflected RF power wave 135-d at the load 130-d because of an impedance mismatch between the transmission line 110-d and the load 130-d. As discussed above, the transmission line 110-d may be a stripline or micro-strip transmission line. The source 120-d, transmission line 110-d, and load 130-d may be, respectively, the source 120, transmission line 110, and load 130 of FIG. 1, 5, 6 or 7.

The transmission system 800 may include a first directional coupler 540-j and a second directional coupler 540-k which may have coupled power ports configured to couple the reflected power 135-d (e.g., isolate the forward power 125-d). The first directional coupler 540-j and the second directional coupler 540-k may be examples of the directional couplers 540 of FIG. 5, 6, or 7. The first directional coupler 540-j and the second directional coupler 540-k may be placed at a distance of ¼ wave separation (or a multiple of ¼ wave separation) along the transmission line 110-d. As discussed above, the first directional coupler 540-j may be coplanar with the second directional coupler 540-k (e.g., on opposite sides of a stripline or microstrip transmission line, etc.).

The transmission system 800 may include a third directional coupler 540-l, which may have a coupled power port 545-l configured to couple the forward power 125-d. The transmission system 800 may have an isolator 860, and the third directional coupler 540-l may be placed before the isolator as illustrated in transmission system 800, or after the isolator 860 (not shown), in some cases. The third directional coupler 540-l may be a unidirectional coupler (e.g., terminated at an isolation port, etc.) and may be any type of coupler including waveguide couplers, coaxial couplers, stripline couplers, micro-strip couplers, and the like. The third directional coupler 540-l may be, for example, similar to the directional couplers 540 of FIG. 5, 6 or 7.

The transmission system 800 may include measurement module 150-d, which may determine the reflected power of transmission system 800 based on measurements of coupled power from the first directional coupler 540-j and second directional coupler 540-k. For example, the measurement module 150-d may determine the reflected power based on an average of measurements of power at the coupled power ports 545-j and 545-k of the first and second directional couplers 540-j and 540-k, respectively. The measurement module 150-d may determine forward power based on a measurement of the coupled power port 545-l of directional coupler 540-l.

In embodiments, the measurement module 150 of FIG. 1, 5, 6, 7 or 8 may feedback an indication of the calculated reflected power (e.g., VSWR, return loss, etc.) to the source 120. The source 120 may use the indication of the calculated reflected power to adjust the forward power 125 so that the power output at the load becomes equal to a target value (e.g., by adjusting a gain of a transmitter at the source 120, etc.). The measurement module 150 or source 120 of FIG. 1, 5, 6, 7 or 8 may also detect error conditions that may indicate that an operational parameter (e.g., maximum reflected power, etc.) may be violated and the source 120 may terminate transmission to avoid potential adverse results. For example, the source 120 may determine that the VSWR exceeds a threshold and may terminate transmission to avoid operation in a potential out-of-range condition or damaging reflected power condition.

In some embodiments, the source 120 of FIG. 1, 5, 6, 7 or 8 may adjust the forward power 125 based on measurements of a transmitted signal during operation of the transmission system. For example, a pilot signal at an operational frequency (e.g., in the middle of a transmission bandwidth range, etc.) may be transmitted periodically and the reflected power for the pilot signal may be measured (e.g., by measurement module 150, etc.) and fed back to the source 120. Thus, the adjustment of the forward power 125 may be performed adaptively during operation and may respond to changes in impedance for the load 130. For example, an antenna may be damaged during use, changing the impedance seen by the source 120. The source 120 may adjust the transmitter gain to provide for the same radiated transmission power from the damaged antenna.

Figure 9:
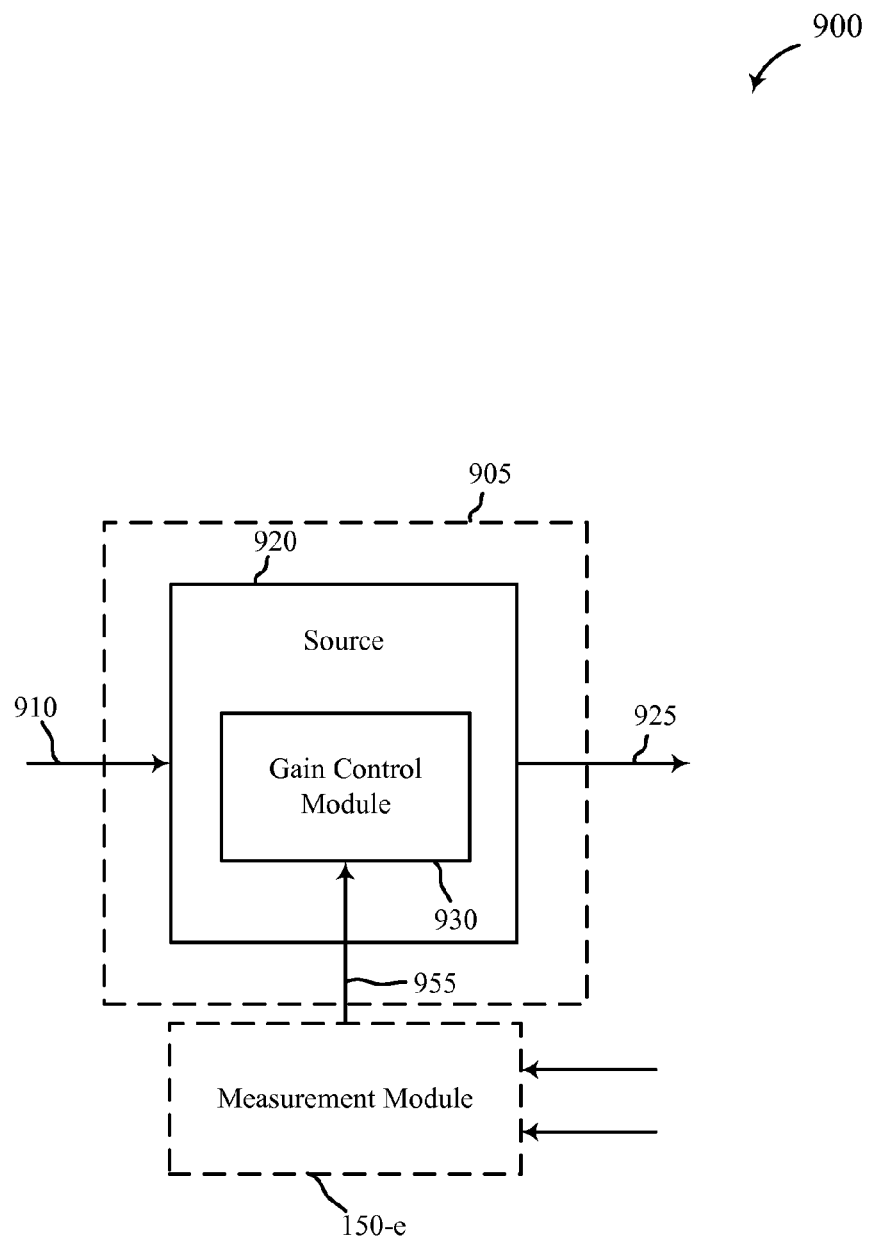
FIG. 9 shows a block diagram of a device for enhanced RF system measurement, in accordance with various embodiments

FIG. 9 shows a block diagram 900 of a device 905 for enhanced RF system measurement, in accordance with various embodiments. The device 905 may illustrate, for example, aspects of transmission systems 100, 500, 600, 700 or 800 of FIG. 1, 5, 6, 7 or 8. The device 905 includes source 920, which may be an example of source 120 of FIG. 1, 5, 6, 7 or 8. Source 920 may include gain control module 930.

Source 920 may receive signals 910 (e.g., digital signals, baseband signals, RF signals, etc.) and may perform processing (e.g., encoding, modulation, upconversion, etc.) to generate RF signal 925 for sending to a load (e.g., for transmission using an antenna, etc.).

Gain control module 930 may receive feedback signals 955, which may indicate reflected power from the load (e.g., VSWR, return loss, etc.). Feedback signals 955 may be obtained from measurement module 150-e, which may be an example of measurement modules 150 of FIG. 1, 5, 6, 7 or 8. As illustrated in FIG. 9, measurement module 150-e may be separate from device 905. However, measurement module 150-e may be a component of device 905, in some cases.

Gain control module 930 may adjust the power of RF signal 925 to compensate for the reflected power. In some embodiments, gain control module 930 may adjust the power of RF signal 925 based on the feedback of the indication of the reflected power to maintain a target power at the load (e.g., target radiated power from an antenna, etc.). Source 920 may generate (e.g., periodically, etc.) pilot signals on RF signal 925 at an operational frequency (e.g., in the middle of a transmission bandwidth range, etc.) and the reflected power for the pilot signals may be measured (e.g., by measurement module 150-e, etc.) and fed back to the gain control module 930 in feedback signals 955. Thus, the gain control module 930 may adjust the power of RF signal 925 adaptively during operation and may respond to changes in impedance for the load.

Figure 10:
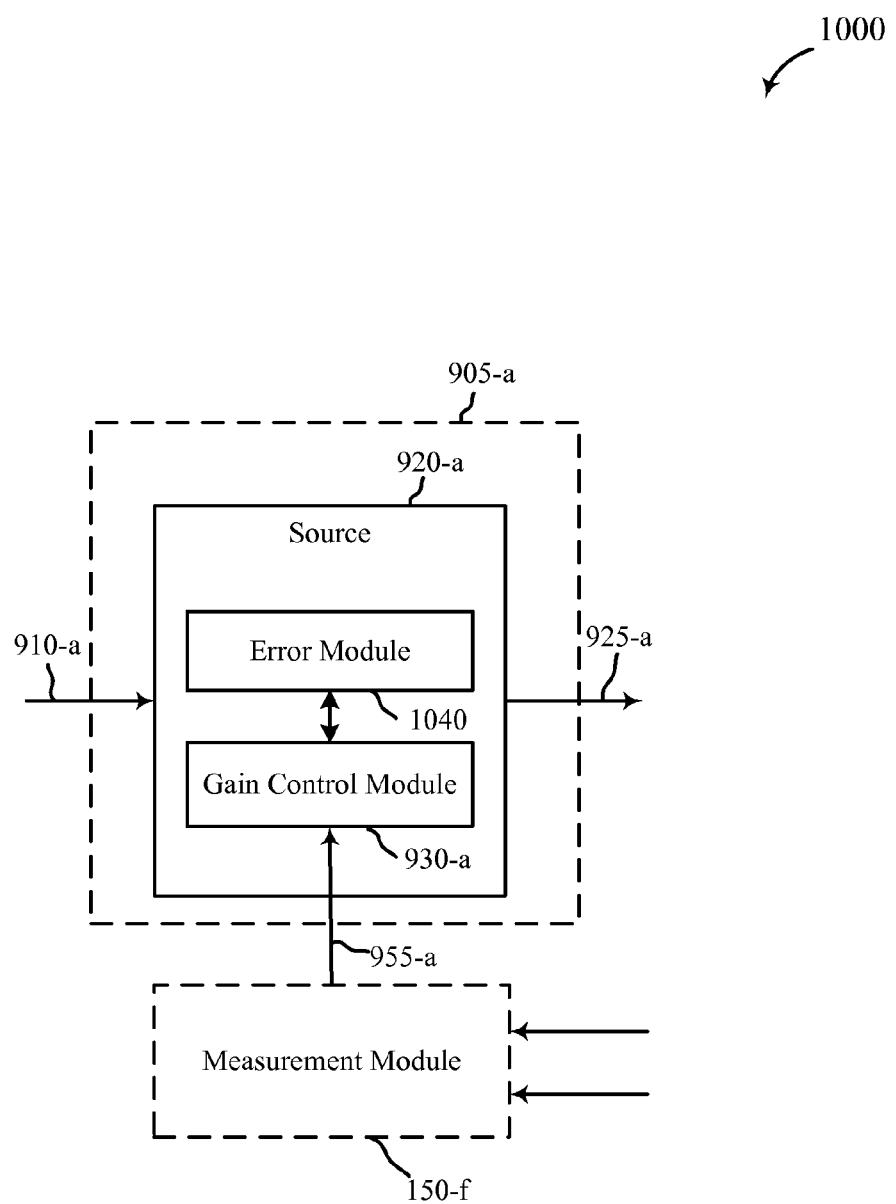
FIG. 10 shows a block diagram of a device for enhanced RF system measurement, in accordance with various embodiments.

FIG. 10 shows a block diagram 1000 of a device 905-a for enhanced RF system measurement, in accordance with various embodiments. The device 905-a may illustrate, for example, aspects of transmission systems 100, 500, 600, 700 or 800 of FIG. 1 or 5-8 or device 905 of FIG. 9. The device 905-a includes source 920-a, which may be an example of source 120 of FIG. 1, 5, 6, 7 or 8 or source 920 of FIG. 9. Source 920 may include gain control module 930-a and error module 1040.

Gain control module 930-a may perform the functions of gain control module 930 of FIG. 9 and may adjust a transmit power of source 920-a based on an indication of reflected power (e.g., VSWR, return loss, etc.) from measurement module 150-f. Measurement module 150-f may be an example of measurement modules 150 of FIG. 1 or 5-9 and may be a component of device 905-a, or may be a separate component, in some cases.

Error module 1040 may detect error conditions that may indicate that an operational parameter (e.g., maximum reflected power, maximum VSWR, etc.) may be violated and the error module 1040 may terminate transmission from source 920-a to avoid potential adverse results. For example, the error module 1040 may determine that the VSWR exceeds a threshold and may terminate transmission from source 920-a to avoid operation in a potential out-of-range condition or damaging reflected power condition.

The components of the devices 905 of FIG. 9 or 10 may, individually or collectively, be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each module may also be implemented, in whole or in part, with instructions embodied in a memory, formatted to be executed by one or more general or application-specific processors.

Figure 11:
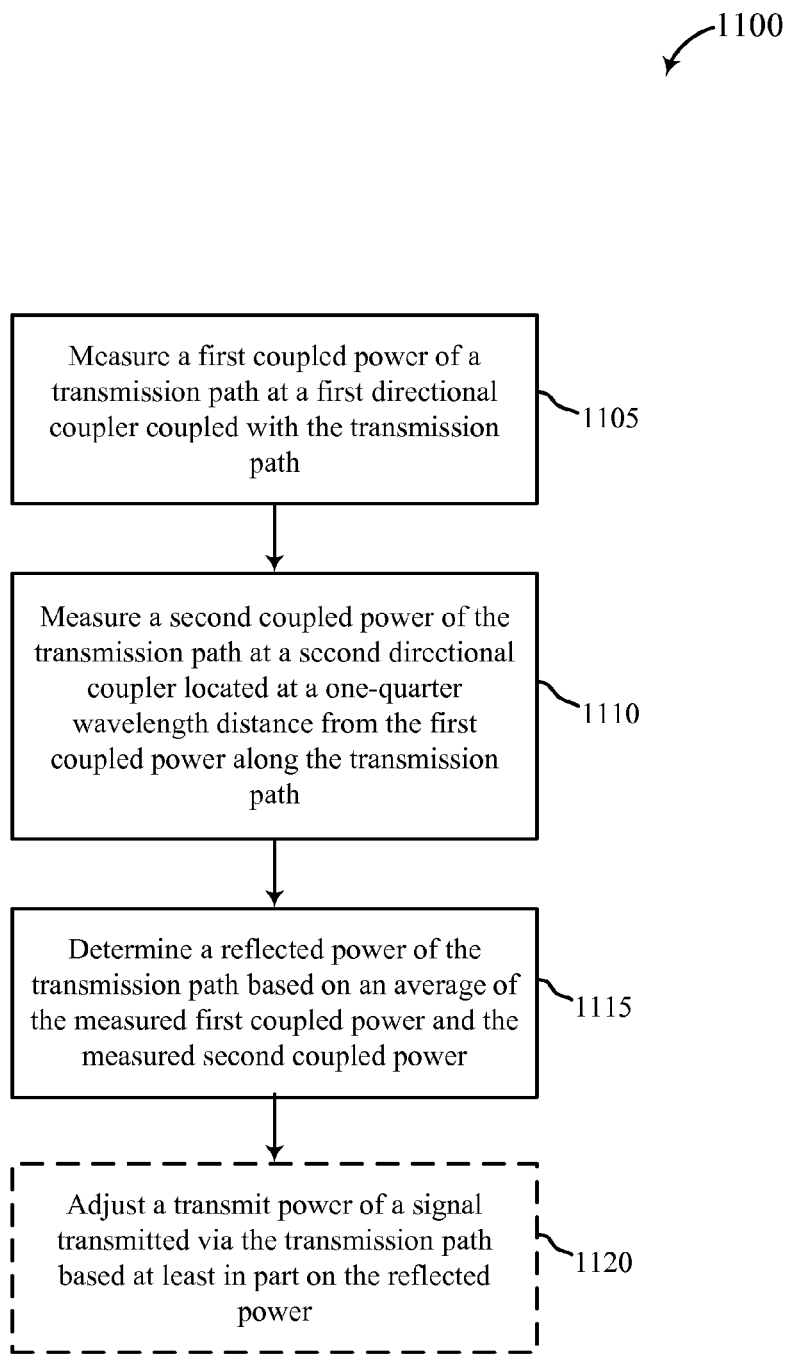
FIG. 11 is a flow chart illustrating an example of a method for enhanced RF system transmission, in accordance with various embodiments.

FIG. 11 is a flow chart illustrating an example of a method 1100 for enhanced RF system transmission, in accordance with various embodiments. For clarity, the method 1100 is described below with reference to aspects of one or more of the transmission systems described with reference to FIG. 1 or 5-8, and/or aspects of one or more of the devices 905 described with reference to FIGS. 9 and 10. In some examples, a device 905 may execute one or more sets of codes to control the functional elements of the device 905 to perform the functions described below. Additionally or alternatively, the device 905 may perform one or more of the functions described below using special-purpose hardware.

At block 1105, the device 905 may measure a first coupled power of a transmission path at a first directional coupler coupled with the transmission path. The first directional coupler may have a coupler directivity in a reflected power direction (e.g., be configured to isolate the forward power).

At block 1110, the device 905 may measure a second coupled power of the transmission path at a second directional coupler coupled with the transmission path and having a coupler directivity in the reflected power direction. The second directional coupler may be located to couple the second coupled power at a one-quarter wavelength distance at an operational frequency from the first coupled power along the transmission path.

At block 1115, the device 905 may determine a reflected power of the transmission path based on an average of the measured first coupled power and the measured second coupled power.

Optionally, the device 905 may adjust a transmit power of a signal transmitted via the transmission path based at least in part on the reflected power at block 1120. The adjusting may include adaptively adjusting the transmit power of the signal based at least in part on the reflected power to generate a transmitted signal from an antenna system coupled to the transmission path at a predetermined power level. In some embodiments, the device 905 may sense a transmit error condition based at least in part on the reflected power and terminate the transmission based on the sensed transmit error condition.

Figure 12:
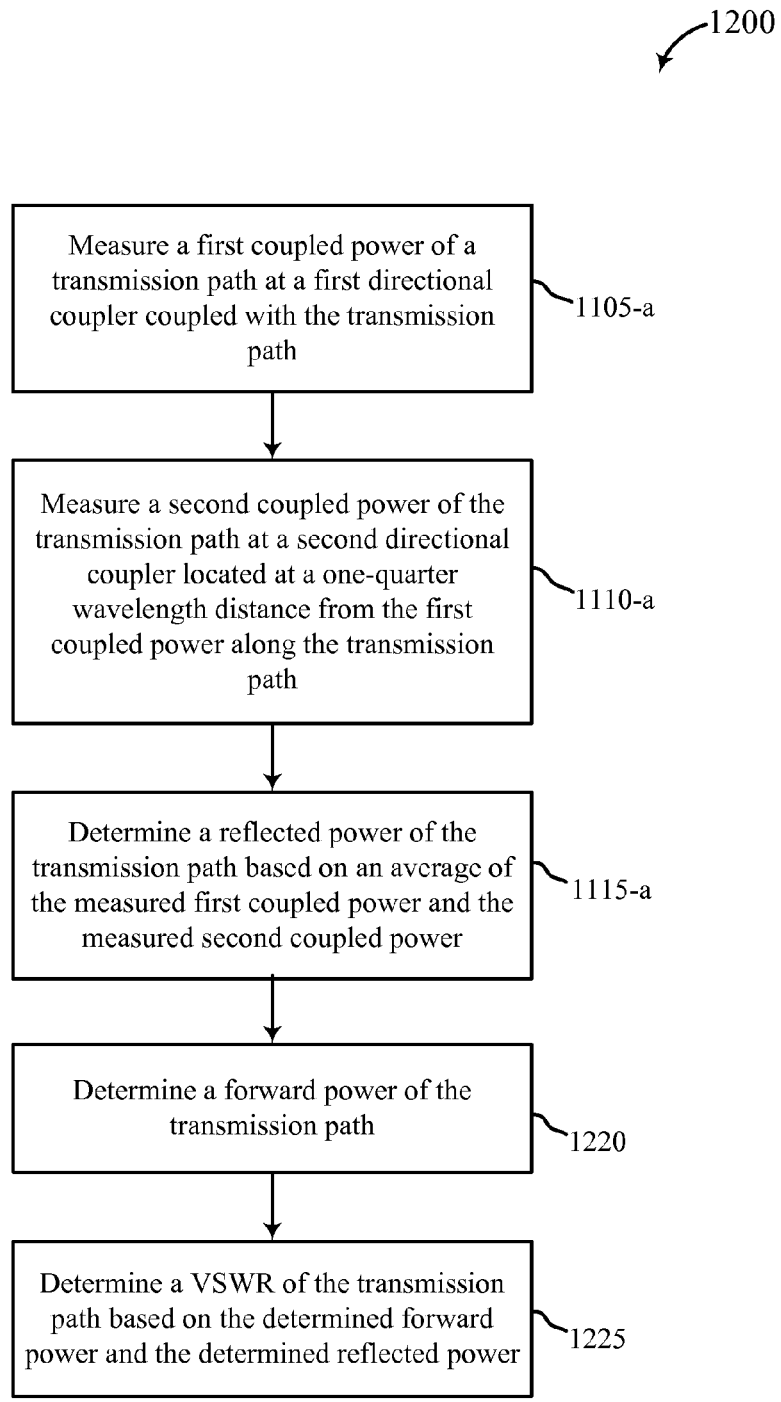
FIG. 12 is a flow chart illustrating an example of a method for enhanced RF system transmission, in accordance with various embodiments.

FIG. 12 is a flow chart illustrating an example of a method 1200 for enhanced RF system transmission, in accordance with various embodiments. For clarity, the method 1200 is described below with reference to aspects of one or more of the transmission systems described with reference to FIG. 1 or 5-8, and/or aspects of one or more of the devices 905 described with reference to FIGS. 9 and 10. In some examples, a device 905 may execute one or more sets of codes to control the functional elements of the device 905 to perform the functions described below. Additionally or alternatively, the device 905 may perform one or more of the functions described below using special-purpose hardware.

At blocks 1105-a, 1110-a, and 1115-a of method 1200, the device 905 may perform the functions described above with reference to blocks 1105, 1110, and 1115 of FIG. 11, respectively.

At block 1220, the device 905 may measure a forward power of the transmission path. For example, the device 905 may measure a third coupled power at a third directional coupler coupled with the transmission path and having a coupler directivity in a forward power direction. In some embodiments, the device 905 may measure a fourth coupled power at a fourth directional coupler coupled with the transmission path and having a coupler directivity in the forward power direction. The fourth directional coupler may be located to couple the fourth coupled power at a one-quarter wavelength distance at the operational frequency from the third coupled power along the transmission path.

At block 1225, the device 905 may determine the VSWR of the transmission path based on the measured forward power (e.g., from the third directional coupler and/or fourth directional coupler, etc.) and the reflected power.

In some examples, aspects from two or more of the methods 1100 and 1200 may be combined. It should be noted that the methods 1100 and 1200 are just example implementations, and that the operations of the methods 1100 and 1200 may be rearranged or otherwise modified such that other implementations are possible.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A transmitter system for wireless communication, comprising:
a first directional coupler coupled with a transmission path and having a coupler directivity in a reflected power direction, the first directional coupler outputting a first coupled power of the transmission path;
a second directional coupler coupled with the transmission path and having a coupler directivity in the reflected power direction, the second directional coupler outputting a second coupled power of the transmission path, wherein the second directional coupler is located to couple the second coupled power at a one-quarter wavelength distance at an operational frequency from the first coupled power along the transmission path; and
a measurement device configured to measure the first coupled power and the second coupled power and determine a reflected power of the transmission path based on an average of the measured first coupled power and the measured second coupled power.

2. The transmitter system of claim 1, further comprising:
a third directional coupler coupled with the transmission path and having a coupler directivity in a forward power direction, the third directional coupler outputting a third coupled power,
wherein the measurement device is configured to measure the third coupled power and determine a voltage standing wave ratio (VSWR) of the transmission path based on the third coupled power and the reflected power.

3. The transmitter system of claim 2, wherein the third directional coupler is located in-between the first directional coupler and the second directional coupler along the transmission path.

4. The transmitter system of claim 3, wherein the first and second directional couplers are coplanar with the transmission path.

5. The transmitter system of claim 2, wherein the third directional coupler is located to couple the third coupled power at a one-eighth wavelength distance at the operational frequency from the first coupled power along the transmission path.

6. The transmitter system of claim 2, further comprising:
a fourth directional coupler coupled with the transmission path and having a coupler directivity in the forward power direction, the fourth directional coupler outputting a fourth coupled power, wherein the fourth directional coupler is located to couple the fourth coupled power at a one-quarter wavelength distance at the operational frequency from the third coupled power along the transmission path,
and wherein the measurement device is configured to measure the fourth coupled power and determine the VSWR of the transmission path further based on the measured fourth coupled power.

7. The transmitter system of claim 1, wherein the first and second directional couplers comprise any of stripline couplers, microstrip couplers, coaxial couplers, waveguide couplers, or combinations thereof.

8. The transmitter system of claim 1, further comprising:
a transmitter coupled to the transmission path and to the measurement device, wherein the transmitter adjusts a transmit power of a signal transmitted via the transmission path based at least in part on the reflected power.

9. The transmitter system of claim 8, wherein the transmitter adaptively adjusts the transmit power of the signal based at least in part on the reflected power to generate a transmitted signal from an antenna system coupled to the transmission path at a predetermined power level.

10. The transmitter system of claim 8, wherein the transmitter is configured to sense a transmit error condition based at least in part on the reflected power and terminate transmission based on the sensed transmit error condition.

11. A method for wireless communication, comprising:
measuring a first coupled power of a transmission path at a first directional coupler coupled with the transmission path and having a coupler directivity in a reflected power direction;
measuring a second coupled power of the transmission path at a second directional coupler coupled with the transmission path and having a coupler directivity in the reflected power direction, wherein the second directional coupler is located to couple the second coupled power at a one-quarter wavelength distance at an operational frequency from the first coupled power along the transmission path; and
determining a reflected power of the transmission path based on an average of the measured first coupled power and the measured second coupled power.

12. The method of claim 11, further comprising:
measuring a third coupled power at a third directional coupler coupled with the transmission path and having a coupler directivity in a forward power direction; and
determining a voltage standing wave ratio (VSWR) of the transmission path based on the measured third coupled power and the reflected power.

13. The method of claim 12, further comprising:
measuring a fourth coupled power at a fourth directional coupler coupled with the transmission path and having a coupler directivity in the forward power direction, wherein the fourth directional coupler is located to couple the fourth coupled power at a one-quarter wavelength distance at the operational frequency from the third coupled power along the transmission path,
and wherein the determining the VSWR of the transmission path is further based on the measured third coupled power.

14. The method of claim 11, further comprising:
adjusting a transmit power of a signal transmitted via the transmission path based at least in part on the reflected power.

15. The method of claim 14, wherein the adjusting comprises adaptively adjusting the transmit power of the signal based at least in part on the reflected power to generate a transmitted signal from an antenna system coupled to the transmission path at a predetermined power level.

16. The method of claim 14, further comprising:
sensing a transmit error condition based at least in part on the reflected power; and
terminating transmission based on the sensed transmit error condition.

17. An apparatus for wireless communication, comprising:
means for coupling a first coupled power of a transmission path, the means for coupling the first coupled power having a coupler directivity in a reflected power direction;
means for coupling a second coupled power of the transmission path, the means for coupling the second coupled power having a coupler directivity in the reflected power direction, wherein the means for coupling the second coupled power is located to couple the second coupled power at a one-quarter wavelength distance at an operational frequency from the first coupled power along the transmission path;

means for measuring the first coupled power and the second coupled power; and means for determining a reflected power of the transmission path based on the measured first coupled power and the measured second coupled power.

18. The apparatus of claim 17, further comprising:

means for coupling a third coupled power of the transmission path, the means for coupling the third coupled power having a coupler directivity in a forward power direction; and means for determining a voltage standing wave ratio (VSWR) of the transmission path based on the measured third coupled power and the reflected power.

19. The apparatus of claim 18, wherein the means for coupling the third coupled power is located in-between the means for coupling the first coupled power and the means for coupling the second coupled power along the transmission path.

20. The apparatus of claim 17, further comprising:

means for adjusting a transmit power of a signal transmitted via the transmission path based at least in part on the reflected power.

\* \* \* \* \*